United States Patent
Tang et al.

(10) Patent No.: US 6,507,064 B1
(45) Date of Patent: Jan. 14, 2003

(54) DOUBLE SIDED CONTAINER CAPACITOR FOR DRAM CELL ARRAY AND METHOD OF FORMING SAME

(75) Inventors: Sanh D. Tang, Boise, ID (US); Robert J. Burke, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/569,570

(22) Filed: May 10, 2000

(51) Int. Cl.[7] .................................... H01L 27/108
(52) U.S. Cl. ........................... 257/306; 257/309
(58) Field of Search .................... 257/306, 309

(56) References Cited

U.S. PATENT DOCUMENTS

| | | |
|---|---|---|
| 5,275,972 A | 1/1994 | Ogawa et al. |
| 5,292,677 A | 3/1994 | Dennison |
| 5,362,666 A | 11/1994 | Dennison |
| 5,369,048 A | 11/1994 | Hsue |
| 5,488,011 A | 1/1996 | Figura et al. |
| 5,837,577 A | 11/1998 | Cherng |
| 5,858,829 A | 1/1999 | Chen |
| 5,866,453 A | 2/1999 | Prall et al. |
| 5,895,239 A | 4/1999 | Jeng et al. |
| 6,222,222 B1 * | 4/2001 | DeBoer et al. ............. 257/309 |

* cited by examiner

Primary Examiner—Gene M. Munson
(74) Attorney, Agent, or Firm—Dickstein Shapiro Morin & Oshinsky LLP

(57) ABSTRACT

An apparatus and method is presented for a DRAM memory cell array exhibiting improved alignment tolerance for bit line contact formation and utilizing closely-spaced double-sided stacked capacitors for increased overall feature density on the circuit die. The use of a sacrificial insulating layer, an etch-stop insulating layer, and insulating spacers surrounding the bit line contact plug permits wet etching of the sacrificial layer to enable double-sided capacitors to be formed close together. In the resulting structure, only the bit line contact plug and insulating sidewall spacers separates adjacent capacitors and hence DRAM cells can be more tightly packed on the circuit die. Another aspect of the invention is improved alignment tolerance of the bit line contact plug. Because the bit line contact plug is formed prior to the double-sided capacitors, and then the double sided capacitors are formed to occupy all of the space laterally surrounding the bit line contact plug and its insulating spacers, mask alignment errors are less likely to affect this arrangement.

64 Claims, 7 Drawing Sheets

DOUBLE SIDED CONTAINER CAPACITOR FOR DRAM CELL ARRAY AND METHOD OF FORMING SAME

BACKGROUND OF THE INVENTION

1. Field of the Invention

The present invention relates to the field of integrated circuits and, more particularly, to an apparatus and method of forming a DRAM cell array with a reduced overall stack height and better alignment tolerance between DRAM container cells and bit line contacts.

2. Description of the Related Art

Modern integrated circuit designers often must confront and solve the problem of space limitations on the circuit die. Because the use and popularity of memory devices, such as dynamic random access memory (DRAM) circuits, has expanded dramatically in recent years, memory circuit manufacturers have been under pressure to increase memory capacity and performance without increasing the space occupied by the circuit.

For example, DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 10 illustrates a portion of a DRAM memory circuit containing two neighboring DRAM cells 100. For each cell, one plate of the storage capacitor 140 is connected to a reference voltage and the other plate is connected to the drain of the access field effect transistor 120. The gate of the access field effect transistor 120 is connected to the word line 180. The source of the field effect transistor 120 is connected to the bit line 160. The word line thus controls access to the storage capacitor 140 by allowing or preventing the logic signal ("0" or "1") on the bit line 160 to be written to or read from the storage capacitor 140.

The manufacturing of a DRAM cell includes the fabrication of a transistor, a capacitor, and contacts to the bit line, the word line, and the reference voltage. DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including stacked capacitors. Stacked capacitors are capacitors which are stacked, or placed, over the access transistor in a semiconductor device. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in trench or planar capacitors is also possible.

One widely used type of stacked capacitor is known as a container capacitor, shown in FIG. 11. One embodiment of a container capacitor is shaped like an upstanding tube (cylinder) having an oval or circular cross section. FIG. 11 illustrates a top view of a portion of a DRAM memory circuit from which the upper layers have been removed to reveal container capacitors 114 arranged around a bit line contact 62. Six container capacitors are shown in FIG. 11, each of which has been labeled with separate reference designations A to F.

To increase density, the bit line contact 62 is shared by neighboring container capacitors 114, including those labeled A and B. The wall of each container capacitor consists of two plates 82, 94 of conductive material such as doped polycrystalline silicon (referred to herein as polysilicon or poly) separated by a dielectric layer 92. The bottom end of the tube is closed, with the inner wall (lower plate 82) in contact with either the drain of the access transistor or a plug which itself is in contact with the drain. The other end of the tube is open (the tube is filled with an insulative material 102 later in the fabrication process). The sidewall and closed end of the tube form a container; hence the name "container capacitor".

The container capacitors in FIG. 11 are double-sided, meaning the lower plate 82 is surrounded on two sides by the upper plate 94, which is connected to a reference voltage on the periphery (not shown). The use of double-sided capacitors further increases the storage capacitance of the DRAM memory cell, reducing the required depth of the container, but their use requires more lateral space for the second side of the upper plate. Lateral space is at a premium due to the need to increase circuit density while preserving isolation of the capacitor plates from the bit line contact. It would be desirable to develop a technique which improves alignment tolerance of the bit line contacts so that double-sided container capacitors could be squeezed closer together.

Additional space savings on the circuit die are required in order to satisfy the demand on DRAM manufacturers for increased capacity memory circuits. In order to remain competitive, DRAM manufacturers need a circuit design that conserves space on the circuit die but does not require unusually expensive or unconventional processing techniques. Therefore, there is a strong need for an increased-density stacked capacitor memory array design exhibiting improved alignment tolerance, utilizing three-dimensional double-sided capacitors and capable of formation by conventional wafer processing and manufacturing techniques.

SUMMARY OF THE INVENTION

The present invention provides an apparatus and method of forming a DRAM memory cell array exhibiting improved alignment tolerance for bit line contact formation and utilizing closely-spaced double-sided stacked capacitors for increased overall feature density on the circuit die.

The above and other features and advantages of the invention are achieved by providing an apparatus and associated method of forming a semiconductor device including:

(a) forming an insulating layer on a semiconductor assembly composed of a plurality of gates and a plurality of conductive plugs formed between the gates;

(b) etching a plurality of holes or contact openings in the insulating layer to expose only selected plugs ('bit-line plugs');

(c) forming insulating spacers on the sidewalls of the contact openings;

(d) forming conductive bit line contact plugs in the contact openings between the insulating spacers;

(e) etching additional contact openings in the insulating layer laterally adjacent the bit line contact plugs and forming double-sided capacitors in the additional contact openings, removing the remainder of the insulating layer with wet etch techniques during capacitor formation; and (f) forming a conductive bit line in contact with the bit line contact plugs.

In the present invention, the use of insulating spacers surrounding the bit line contact plug, and a wet etch that selectively stops at those spacers, permits the double-sided capacitors to be formed close together. Only the previously-formed bit line plug and insulating sidewall spacers separates adjacent capacitors from the bit line contact and hence DRAM cells can be more tightly packed on the circuit die.

Another aspect of the invention is improved alignment tolerance of the bit line contact plug. Because the bit line contact plug is formed prior to the double-sided capacitors, and then the double sided capacitors are formed to occupy all of the space laterally surrounding the bit line contact plug and its insulating spacers, mask alignment errors that plagued prior art devices (with after-formed bit line contact plugs) are less likely to affect this arrangement.

The apparatus of the invention includes a plurality of gates and a plurality of closely-spaced container capacitors formed above contact plugs formed between the gates. The container capacitors are separated by a bit line contact plug and an insulating spacer surrounding the plug. The apparatus is formed to permit close spacing of the container capacitors relative to each other, wherein only an insulating spacer separates the contact plug from a container capacitor on either side of the plug.

Furthermore, the present invention provides these and other advantages solely using processing techniques conventionally employed in the manufacture of semiconductor devices. No unusually expensive or cumbersome steps are required in the method of the present invention, resulting in improved device performance without substantially increased cost.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

DRAM memory circuits are currently the most popular type of memory circuit used in the main memory of processor-based systems. Therefore, the invention will be discussed in connection with DRAM memory circuits. However, the invention has broader applicability and is not limited to DRAM memory circuits. It may be used in any other type of memory circuit, such as an SRAM (static random access memory), as well as in any other circuit in which electrical contacts are formed in close proximity to, and intended to be insulated from, other circuit devices.

Also, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

No particular order is required for the method steps described below, with the exception of those logically requiring the results of prior steps, for example, in FIG. 3, formation of insulating spacers 54 on the sidewalls of bit line contact via 56 logically requires the prior formation of the bit line contact via 56. Otherwise, enumerated steps are provided below in an exemplary order which may be altered, for example, in FIG. 2, formation of gate structures 14 and plugs 34, 38 may be rearranged using masking and etching steps as is known in the art.

Figure 1:
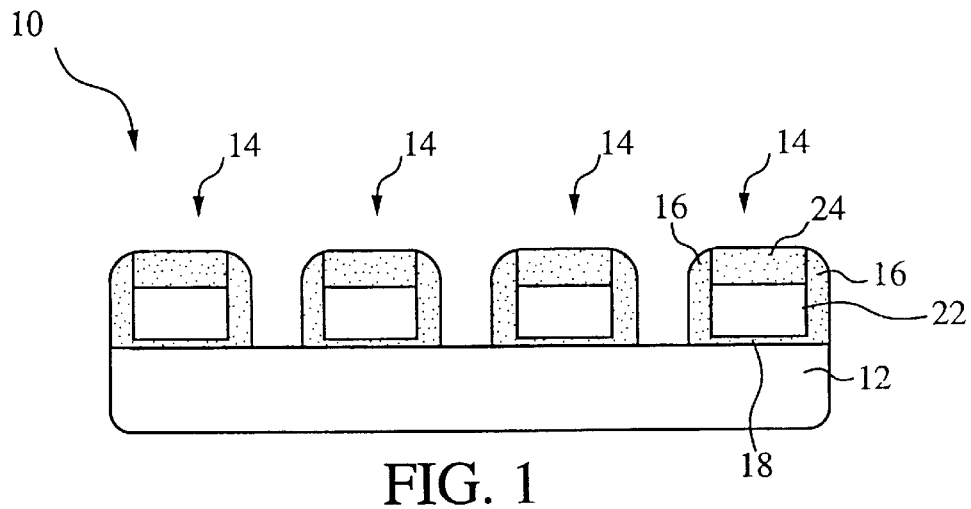
FIG. 1 is a fragmentary vertical cross-sectional view of a DRAM cell array formed in accordance with an embodiment of the present invention at an early stage of formation.

FIG. 1 shows a DRAM cell array 10 at an early stage of formation. The method of the present invention commences with the formation of gate structures 14 on substrate 12. Each gate structure 14 includes gate oxide layer 18, access gate 22, sidewall spacers 16 and gate top insulator 24. FIG. 1 shows four identical gate structures 14 with an area adjacent and between each pair of gate structures 14 in which the substrate 12 is exposed.

Substrate 12 and gate structures 14 are formed using techniques well known in the art, including material deposition, masking, etching, doping, or any combination of these or other known techniques. Also, the material composition of the substrate 12 and gate structures 14 are not limited to any particular combination, and may be formed from a wide variety of materials known in the art. For instance, the access gate 22 may be formed from conductive polysilicon, the gate oxide layer 18 and sidewall spacers 16 may be formed from an oxide of silicon or silicon nitride, gate top insulator 24 may be formed from silicon nitride or tetraethylorthosilicate (TEOS), and substrate 12 may be formed from a single-crystal silicon wafer.

Figure 2:
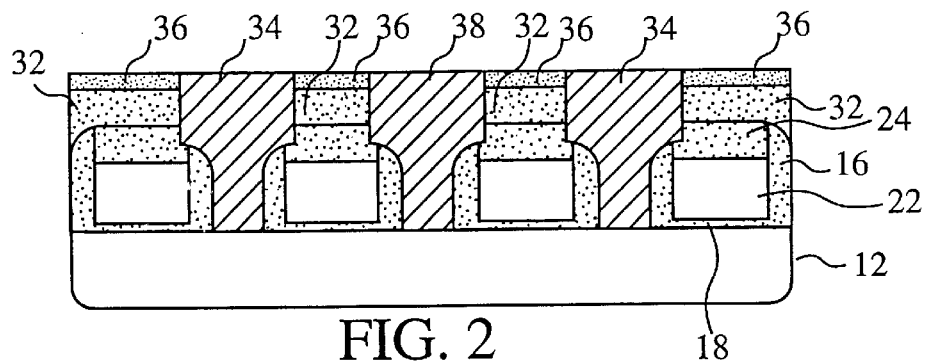
FIG. 2 is a fragmentary vertical cross sectional view of the array of FIG. 1 at a later stage of formation.

Referring to FIG. 2, the method continues with the deposition of a first thick insulating layer 32 on the gate structures 14 and substrate 12. This is followed by chemical/mechanical planarization (CMP) of the insulating layer 32 and deposition on it of a first etch-stop insulating layer 36. Photolithographic techniques well known in the art are then used to define and etch first vias in the insulating layers 32, 36 to expose the surface of the substrate 12 between the gate structures 14. Conductive plugs are formed in the first vias to produce cell plugs 34 and bit line plug 38 in electrical contact with the substrate 12. A CMP step is again used to planarize and remove excess conductive plug material. The resulting structure at this stage is shown in FIG. 2.

First thick insulating layer 32 is preferably formed from borophosphosilicate glass (BPSG), and first etch-stop insulating layer 36 is preferably formed from $Si_3N_4$ (silicon nitride). However, any combination of insulating materials known in the art to permit selective etching of layer 32 with etch-stop at layer 36 may be used. Also, conductive plugs 34, 38 are preferably formed from polysilicon doped with impurities to enhance conductivity, but may be formed from any conductive material compatible with later processing steps.

Figure 3:
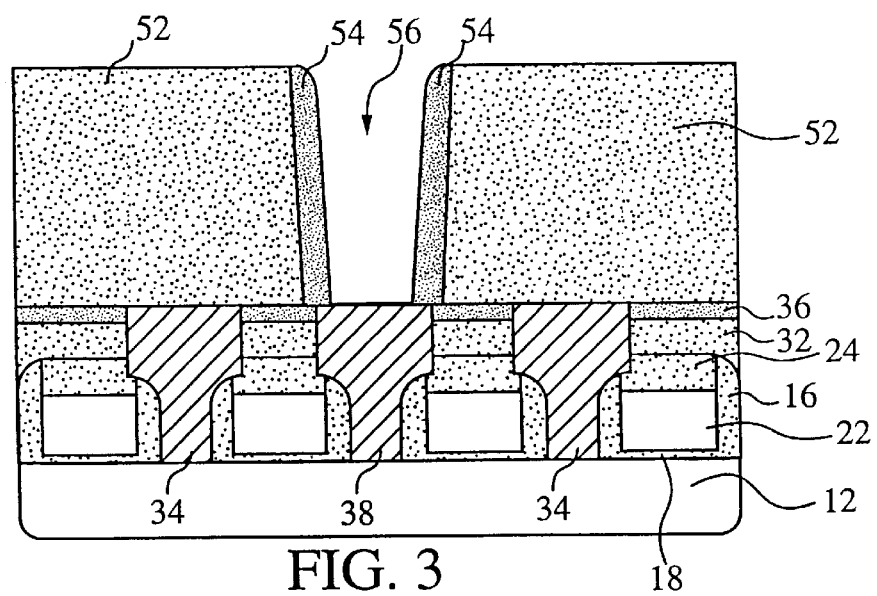
FIG. 3 is a fragmentary vertical cross sectional view of the array of FIG. 2 at a later stage of formation.

Referring to FIG. 3, a second thick insulating layer 52 is formed on the planarized etch-stop insulating layer 36 and plugs 34, 38, and a bit line contact via 56 is patterned and etched in the insulating layer 52. Insulating spacers 54, also known as insulated sidewalls 54, are then formed by depositing an insulating material (different from the material of insulating layer 52) and etching it back to form spacers 54 on the sidewalls of bit line contact via 56.

Second thick insulating layer 52 is preferably formed from BPSG, and insulating spacers 54 are preferably formed from silicon nitride, although any combination of materials for which insulating spacers 54 act as an etch-stop for wet-etching of insulating layer 52 may be used.

Figure 4:
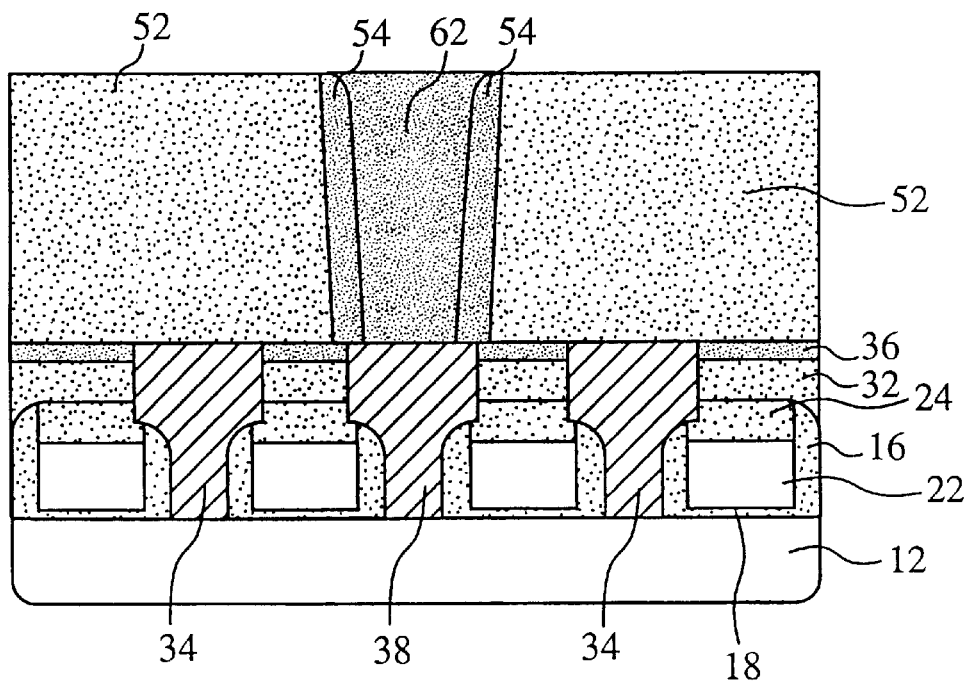
FIG. 4 is a fragmentary vertical cross sectional view of the array of FIG. 3 at a later stage of formation.

Referring to FIG. 4, the method of the present invention continues with formation of the bit line contact plug 62 in bit line contact via 56 between insulating spacers 54. Bit line contact plug 62 is preferably formed from conductively-doped polysilicon (poly), although tungsten (W) may also be used, depending on processing steps subsequent to the method of the present invention and well known in the art which may require the use of either W or poly. A CMP or etch step may be used at this point to remove excess conductive material and obtain a planar surface of insulating layer 52.

Figure 5:
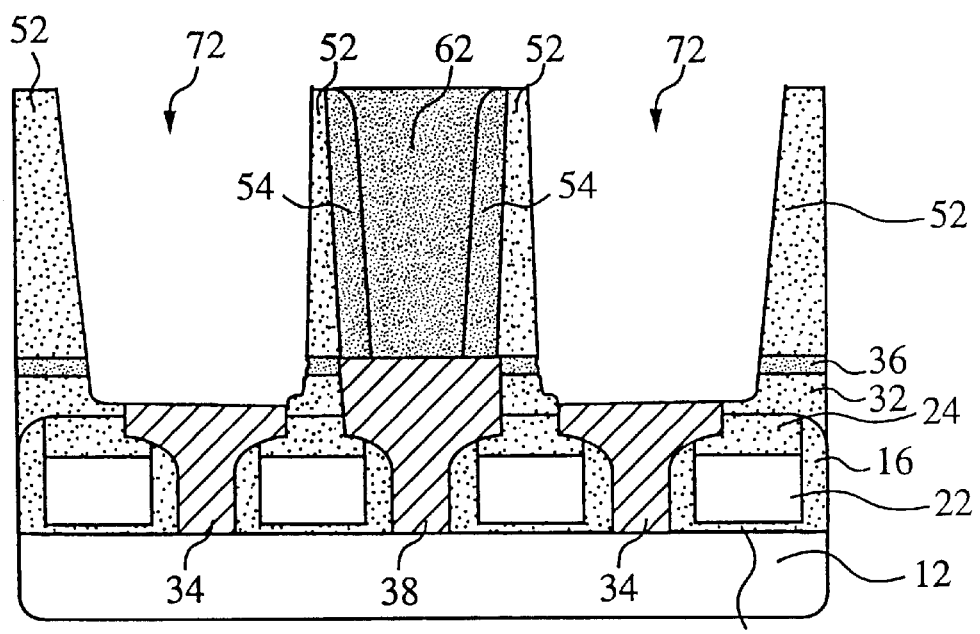
FIG. 5 is a fragmentary vertical cross sectional view of the array of FIG. 4 at a later stage of formation.

Referring to FIG. 5, container cell vias 72 are patterned and etched in second thick insulating layer 52 in areas laterally adjacent said bit line contact plug 62. Container cell vias 72 must be formed deep enough to expose cell plugs 34., but not so wide as to remove insulating spacers 54.

Figure 6:
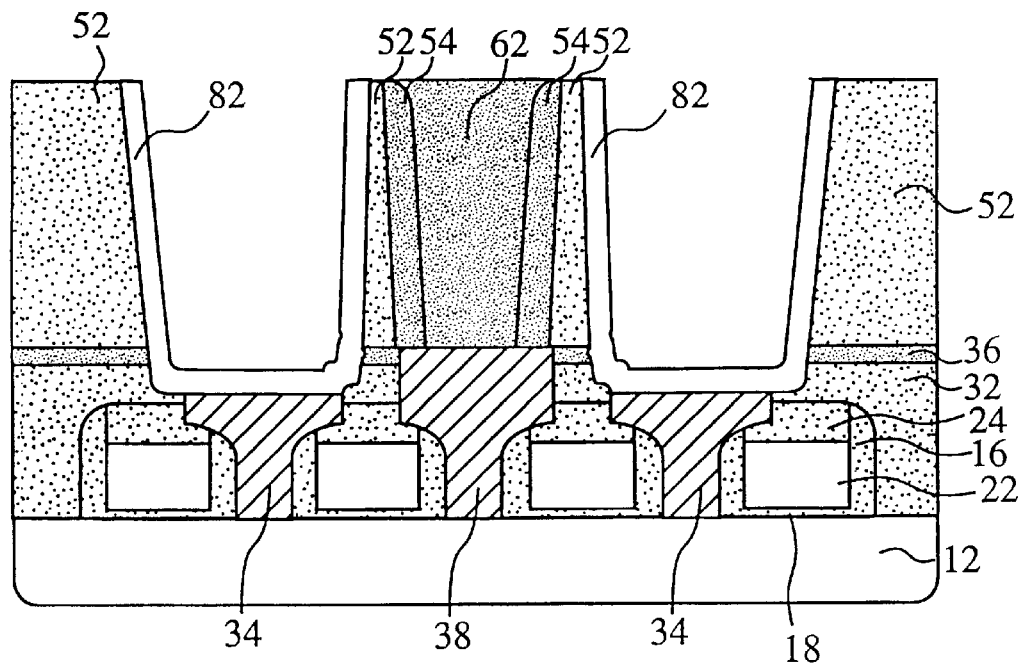
FIG. 6 is a fragmentary vertical cross sectional view of the array of FIG. 5 at a later stage of formation.

Referring to FIG. 6, the method continues with the formation of lower capacitor plates 82 in container cell vias 72. Lower capacitor plates 82 may be deposited or grown according to techniques of formation known in the art. Lower capacitor plates 82 are preferably formed from conductively-doped polysilicon, but may be formed from any conductive material compatible with later processing steps. A CMP or etch step is used at this point to remove excess conductive material from insulating layer 52 and bit line contact plug 62.

Figure 7:
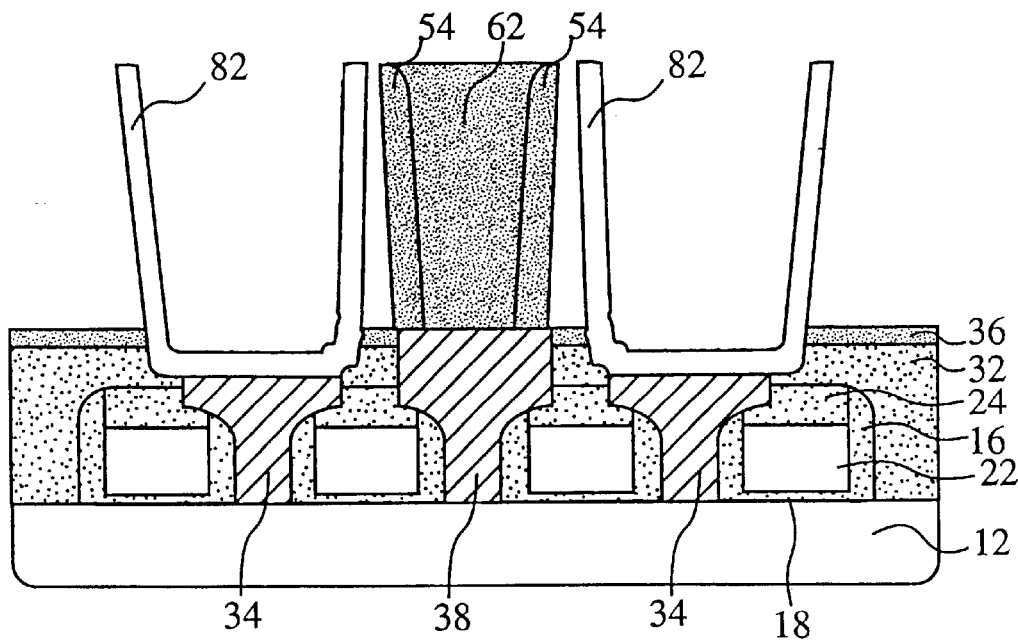
FIG. 7 is a fragmentary vertical cross sectional view of the array of FIG. 6 at a later stage of formation.

Referring to FIG. 7, the method of the present invention continues with wet etching of second thick insulating layer 52. This wet etch step is so conducted as to selectively stop at first etch-stop insulating layer 36, insulating spacers 54, and bit line contact plug 62. By wet-etching and selectively stopping at layer 36, spacers 54 and bit line contact plug 62, insulating layer 52 can be entirely removed, in particular from the tight areas between insulating spacers 54 and lower capacitor plates 82 on either side of bit line contact plug 62. Insulating layer 52 is thus used as a sacrificial layer. The wet etch may be a wet HF dip.

Figure 8:
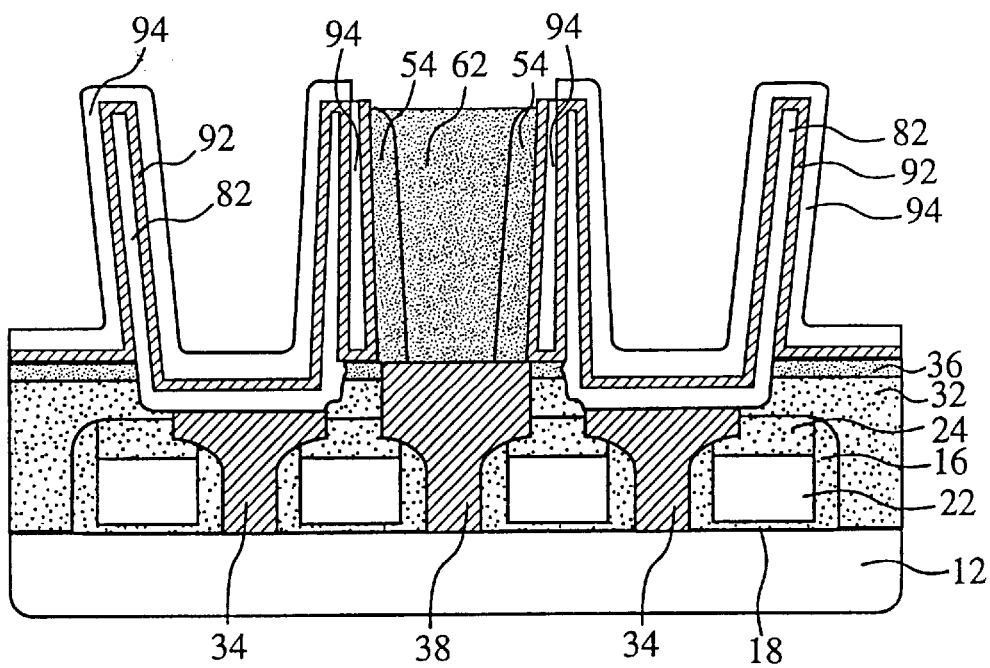
FIG. 8 is a fragmentary vertical cross sectional view of the array of FIG. 7 at a later stage of formation.
Figure 10:
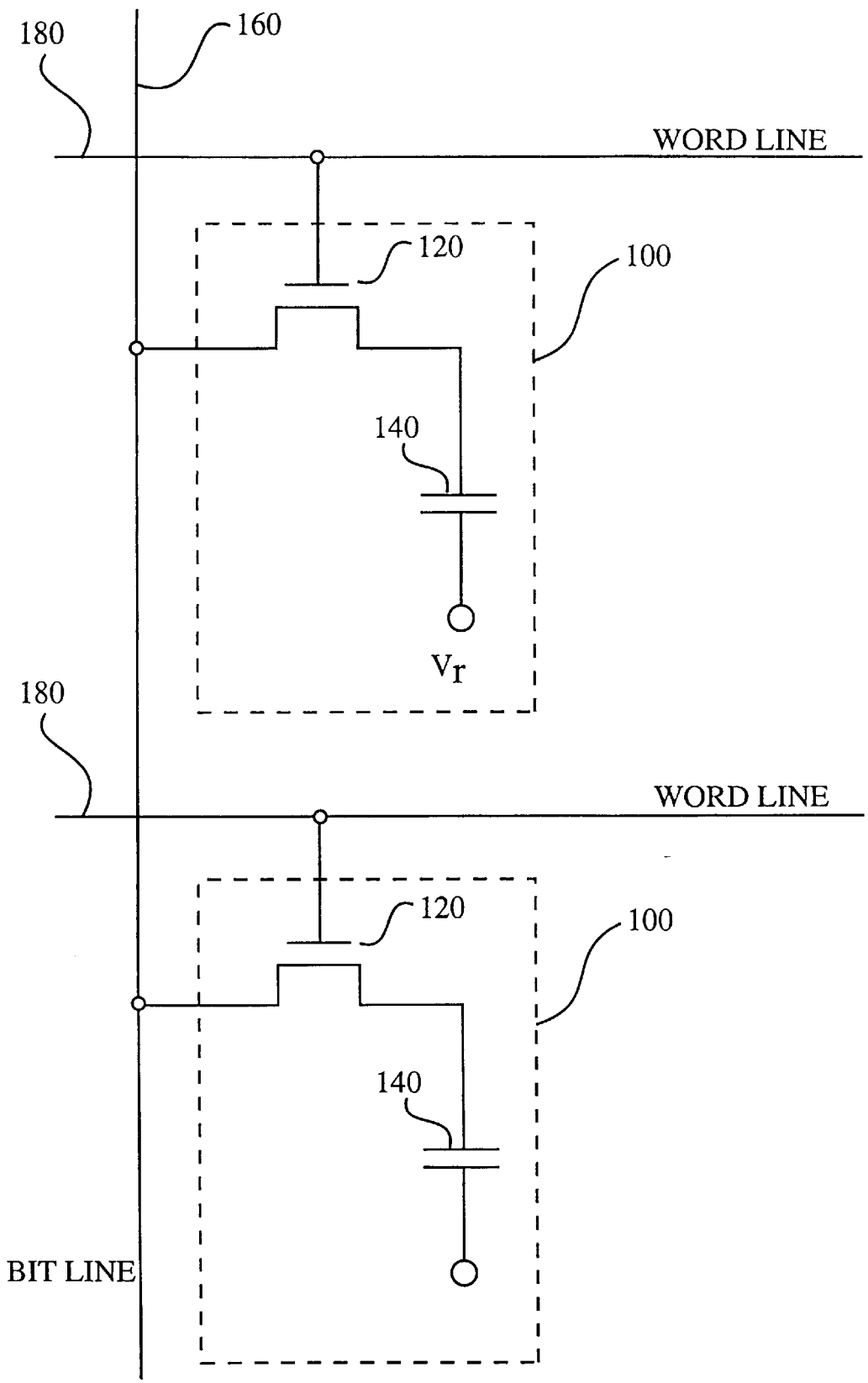
FIG. 10 is a fragmentary schematic diagram of a DRAM circuit topology formed in accordance with an embodiment of the present invention.

Referring to FIG. 8, the method continues with the formation of thin dielectric layer 92 on lower capacitor plates 82, followed by formation of upper capacitor plates 94 on dielectric layer 92. Upper capacitor plates 94 are electrically connected in the periphery (not shown) to reference voltage Vr, as depicted in FIG. 10. In particular, the upper plates 94 and dielectric layer 92 are formed in the tight areas between the lower plates 82 and the insulating spacers 54 such that only the spacers 54 and the dielectric layer 92 separates the upper plates 94 from the bit line contact plug 62. Also, as shown in FIG. 8, only the spacer 54, dielectric layer 92 and the upper plate 94 separates the bit line contact plug 62 from the lower plate 82. This arrangement allows the DRAM circuit elements to be squeezed much closer together, saving space on the integrated circuit die.

Still referring to FIG. 8, the area over the bit line contact plug 62 is then patterned and the upper capacitor plate and dielectric layer 92 etched to expose contact plug 62 and prevent a short circuit between the capacitor components (plates 82, 94 and dielectric layer 92) and the bit line contact plug. The portion etched is shown as etch region 122 in FIG. 11.

Dielectric layer 92 is preferably formed from a nitride film using rapid thermal nitridation (RTN), although various other methods and materials may be used as is known in the art. Upper capacitor plates 94 may be deposited or grown according to techniques of formation known in the art and are preferably formed from conductively-doped polysilicon, but may be formed from any conductive material compatible with later processing steps.

Figure 9:
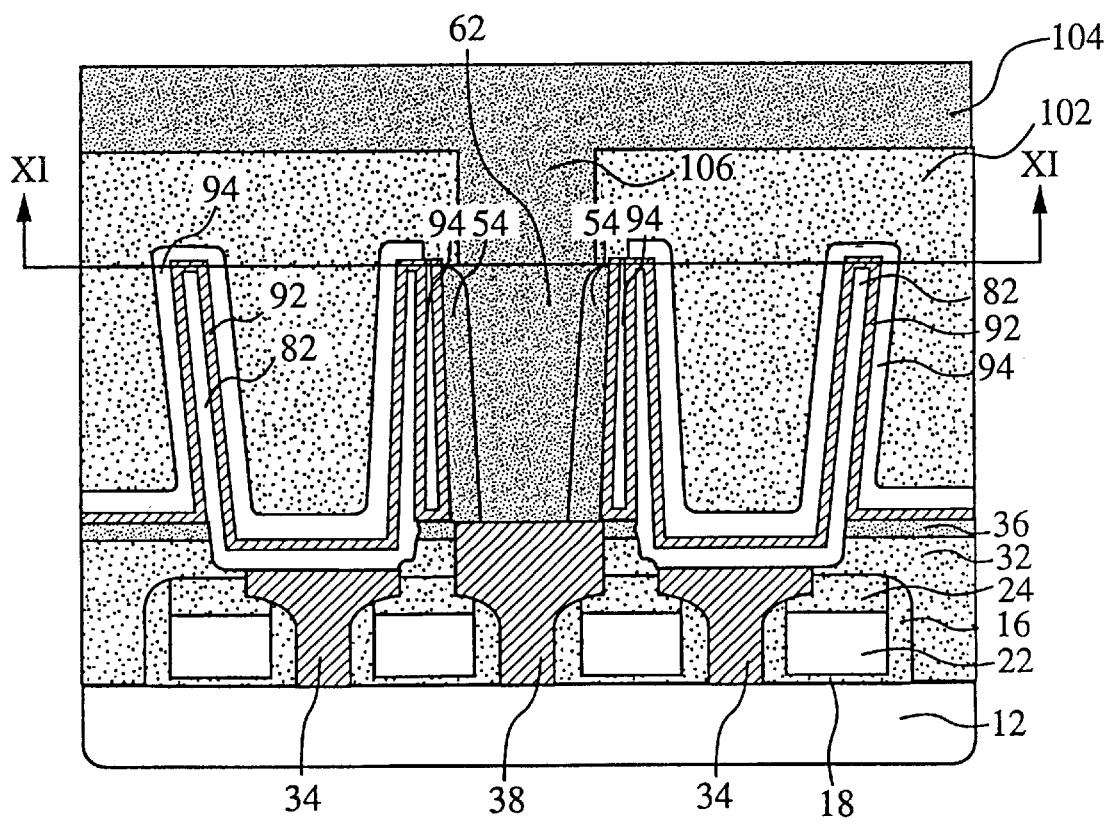
FIG. 9 is a fragmentary vertical cross sectional view of the array of FIG. 8 at a later stage of formation.

Referring to FIG. 9, a third thick insulating layer 102 is formed on at least upper capacitor plate 94 and bit line contact plug 62. A CMP or etch may be used to planarize the array 10. Then a bit line contact via is patterned and etched in insulating layer 102 and bit line contact 106 is formed in the via. A bit line 104 may be formed concurrently or during later processing steps for electrical connection in the periphery to adjacent devices (not shown).

Third thick insulating layer 102 is preferably deposited BPSG, but other insulating materials and methods of formation may be used as is known in the art. The bit line contact 106 and bit line 104 are preferably formed from metal deposited concurrently, but may be formed from other conductive materials using various methods. In FIG. 9, section lines "XI—XI" designate the cross-section for which FIG. 11 shows a top view.

Figure 11:
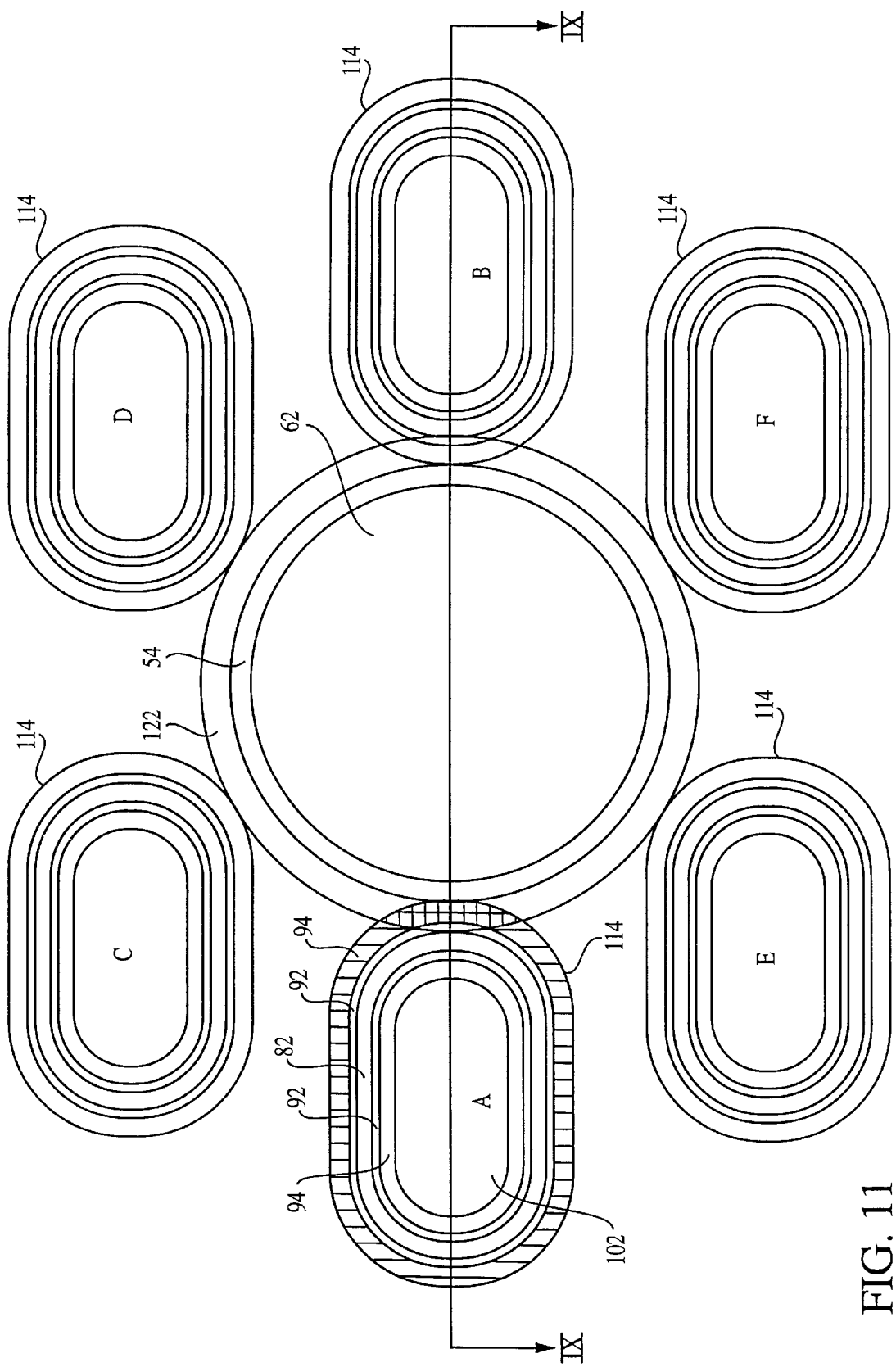
FIG. 11 is fragmentary top view of a DRAM cell array formed in formed in accordance with an embodiment of the present invention.

Likewise, section lines "IX—IX" in FIG. 11 designate the cross section for which FIG. 9 shows a side view. FIG. 11 illustrates six adjacent container capacitors 114, labeled A–F. The memory cells with capacitors labeled A and B are each accessed through bit line contact plug 62. Each container capacitor 114 is an oval-shaped, double-sided capacitor and includes upper plate 94 on two sides of lower plate 82, the plates 94, 82 being separated by thin dielectric layer 92. In the middle of each capacitor 114 is a portion of third thick insulating layer 102.

As shown in FIG. 11, bit line contact plug 62 is formed within and surrounded by insulating spacer 54. Etch region 122 is also shown illustrating the portion of upper plate 94 and dielectric layer 92 removed to expose bit line contact plug 62 for later electrical connection to the bit line 104 (see FIG. 8 and accompanying text).

It is important to understand that upper capacitor plate 94, like the rest of each container cell 114, is three-dimensional. Although in FIG. 9 it appears that a portion of upper plate 94 is not electrically connected to the remainder of upper plate 94, it is shown in FIG. 11 that only a small portion of upper plate 94 is removed in an area proximate to the bit line contact plug 62. The portion of upper plate 94 in question is shown double hatched in FIG. 11 for container cell A. The portion of upper plate 94 shown disconnected in FIG. 9 is actually connected in the three-dimensional pathway extending along the outside perimeter of upper plate 94, shown hatched in FIG. 11 for container cell A.

FIG. 11 illustrates how the method of the present invention permits upper capacitor plates 94 to be formed immediately adjacent insulating spacers 54 formed on the sidewalls surrounding bit line contact plug 62. This arrangement permits circuit features to be formed closer together, conserving space on the circuit die. In addition, double-sided capacitors are formed, reducing the depth required to form container cells of a given capacitance and resulting in a decrease of the overall stack depth.

Figure 12:
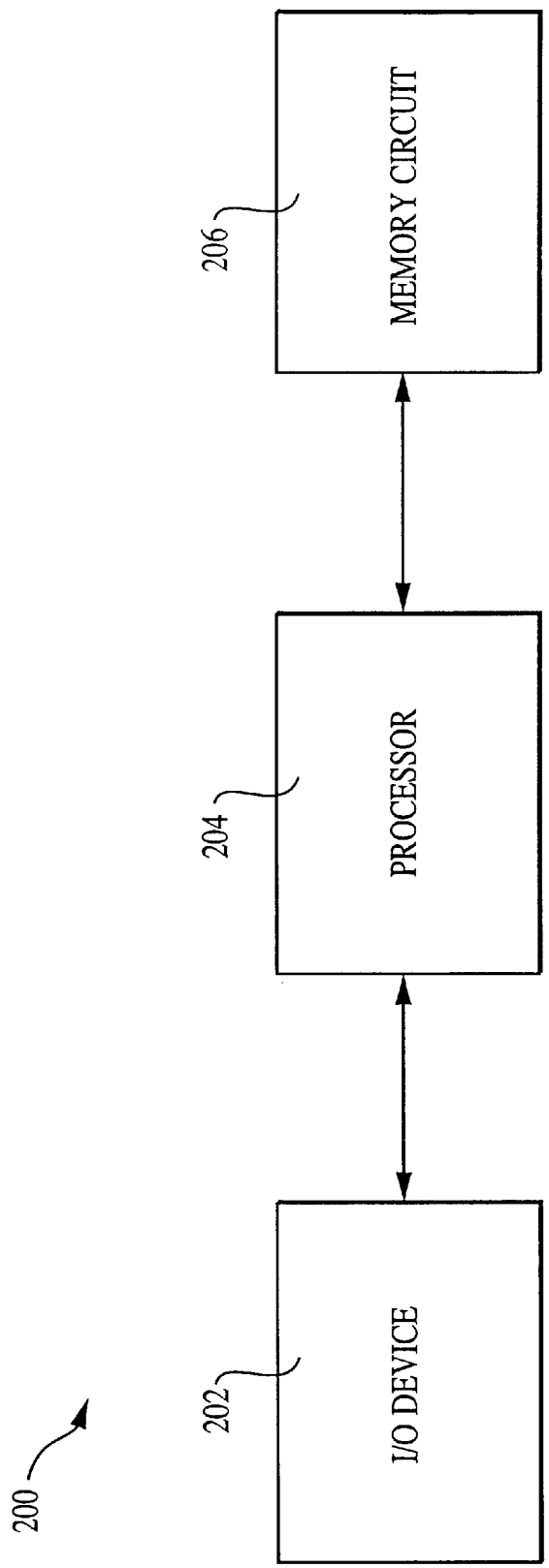
FIG. 12 is a processor-based system including a semiconductor device formed in accordance with an embodiment of the present invention.

FIG. 12 illustrates a processor-based system 200, e.g. a computer system, according to one embodiment of the present invention. The processor-based system 200 comprises a CPU (central processing unit) 204, a memory circuit 206, and an I/O (input/output) device 202. The memory circuit 206 contains a DRAM memory circuit including semiconductor devices constructed in accordance with the present invention. Memory other than DRAM may be used. Also, the CPU 204 may itself be an integrated processor which utilizes semiconductor devices constructed in accordance with the present invention, and both processor 204 and memory circuit 206 may be integrated on a single circuit chip.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor device provided with a capacitor, comprising:
    a semiconductor structure;
    a conductor formed over said semiconductor structure, said conductor having an insulated sidewall formed thereon;
    a capacitor having a dielectric layer formed between a first and a second electrode said capacitor being formed adjacent said insulated sidewall such that only said insulated sidewall and said dielectric layer separates said conductor from said second electrode.

2. The semiconductor device of claim 1 wherein said capacitor is a double-sided capacitor.

3. The semiconductor device of claim 1 wherein said insulated sidewall is formed of an insulating material which selectively stops a wet etch, said conductor is formed of a conductive material which selectively stops said wet etch, and said second electrode is formed of a conductive material which stops said wet etch.

4. The semiconductor device of claim 1 wherein said second conductive electrode is formed of doped polysilicon.

5. The semiconductor device of claim 1 wherein said insulated sidewall is formed of $Si_3N_4$.

6. The semiconductor device of claim 1 wherein said conductor is formed of tungsten or doped polysilicon.

7. The device of claim 1 wherein only the insulated sidewall, said dielectric layer and said second electrode separates said conductor from said first electrode.

8. The semiconductor device of claim 1 further comprising another said capacitor formed adjacent said insulated sidewall.

9. The semiconductor device of claim 1 further comprising a plurality of said capacitors formed adjacent said insulated sidewall.

10. A dynamic random access memory (DRAM) cell array, comprising:
    at least one conductor with an insulated sidewall formed over a semiconductor structure;
    at least one DRAM cell capacitor having a dielectric layer between a first and a second conductive electrode said capacitor being formed adjacent said insulated sidewall such that only said insulated sidewall and said dielectric layer separates said conductor from said second electrode.

11. The DRAM cell array of claim 10 wherein said DRAM cell capacitor is a double-sided DRAM cell capacitor.

12. The DRAM cell array of claim 10 wherein only the insulated sidewall, said dielectric layer and said second electrode separates said conductor from said first electrode.

13. A semiconductor device provided with a capacitor, comprising:
    a first insulating layer overlying at least a portion of a semiconductor structure;
    a capacitor having a dielectric layer between a first and a second electrode, said capacitor being formed in at least said first insulating layer, said first electrode being in electrical contact with a conductive cell plug in said semiconductor structure; and
    a bit line contact plug having an insulated sidewall formed adjacent to said capacitor, wherein said bit line contact plug is separated from said second electrode only by said insulated sidewall and said dielectric layer, said bit line contact plug being in electrical contact with a conductive bit line plug in said semiconductor structure.

14. The semiconductor device of claim 13 wherein said capacitor is a double-sided capacitor.

15. The semiconductor device of claim 13 wherein said first insulating layer and said insulated sidewall are formed of an insulating material which selectively stops a wet etch, said bit line contact plug is formed of a conductive material which stops said wet etch, and said second electrode is formed of a conductive material which stops said wet etch.

16. The semiconductor device of claim 13 wherein said second electrode is formed of doped polysilicon.

17. The semiconductor device of claim 13 wherein said first insulating layer and said insulated sidewall are formed of $Si_3N_4$.

18. The semiconductor device of claim 13 wherein said cell plug and said bit line plug are formed of doped polysilicon.

19. The semiconductor device of claim 13 wherein said cell plug and said bit line plug are formed of doped hemispherical grain polysilicon.

20. The semiconductor device of claim 13 wherein said bit line contact plug is formed of tungsten or doped polysilicon.

21. The device of claim 13 wherein only the insulated sidewall, said dielectric layer and said second electrode separates said bit line contact plug from said first electrode.

22. A dynamic random access memory (DRAM) cell array, comprising:
   a first insulating layer overlying at least a portion of a semiconductor structure;
   at least one DRAM cell capacitor having a dielectric layer between a first and a second conductive electrode said capacitor being at least partially formed in at least said first insulating layer, said first electrode being in electrical contact with a conductive cell plug in said semiconductor structure; and
   at least one bit line contact plug having an insulated sidewall formed adjacent to said at least one capacitor, wherein said bit line contact plug is separated from said second electrode only by said insulated sidewall and said dielectric layer, said bit line contact plug being in electrical contact with a conductive bit line plug in said semiconductor structure.

23. The DRAM cell array of claim 22 wherein said at least one DRAM cell capacitor is a double-sided capacitor.

24. The DRAM cell array of claim 22 wherein said first insulating layer and said insulated sidewall are formed of an insulating material which selectively stops a wet etch, said bit line contact plug is formed of a conductive material which stops said wet etch, and said second electrode is formed of a conductive material which stops said wet etch.

25. The DRAM cell array of claim 22 wherein said second electrode is formed of doped polysilicon.

26. The DRAM cell array of claim 22 wherein said first insulating layer and said insulated sidewall are formed of $Si_3N_4$.

27. The DRAM cell array of claim 22 wherein said cell plug and said bit line plug are formed of doped polysilicon.

28. The DRAM cell array of claim 22 wherein said cell plug and said bit line plug are formed of doped hemispherical grain polysilicon.

29. The DRAM cell array of claim 22 wherein said bit line contact plug is formed of tungsten or doped polysilicon.

30. The DRAM cell array of claim 22 wherein only the insulated sidewall, said dielectric layer and said second electrode separates said bit line contact plug from said first electrode.

31. A processor-based system, comprising:
   a processor;
   a memory circuit connected to said processor, said memory circuit including a semiconductor device comprising:
      a conductor formed over a semiconductor structure;
      an insulated sidewall formed on said conductor; and
      a capacitor having a dielectric layer between a first and a second conductive electrode, said capacitor being formed adjacent said insulated sidewall such that only said insulated sidewall and said dielectric layer separates said conductor from said second electrode.

32. The processor-based system of claim 31 wherein said capacitor is a double-sided capacitor.

33. The processor-based system of claim 31 wherein only the insulated sidewall, said dielectric layer and said second electrode separates said conductor from said first electrode.

34. A processor-based system, comprising:
   a processor;
   a memory circuit connected to said processor, said memory circuit including a semiconductor device comprising:
      a first insulating layer overlying at least a portion of a semiconductor structure;
      a capacitor having a dielectric layer between a first and a second conductive electrode, said capacitor being formed on at least said first insulating layer, said first electrode being in electrical contact with a conductive cell plug in said semiconductor structure; and
      a bit line contact plug having an insulated sidewall formed adjacent to said capacitor, wherein said bit line contact plug is separated from said second electrode only by said insulated sidewall and said dielectric layer, said bit line contact plug being in electrical contact with a conductive bit line plug in said semiconductor structure.

35. The processor-based system of claim 34 wherein said capacitor is a double-sided capacitor.

36. The processor-based system of claim 34 wherein said first insulating layer and said insulated sidewall are formed of an insulating material which selectively stops a wet etch, said bit line contact plug is formed of a conductive material which stops said wet etch, and said second electrode is formed of a conductive material which stops said wet etch.

37. The processor-based system of claim 34 wherein said first insulating layer and said insulated sidewall are formed of $Si_3N_4$.

38. The processor-based system of claim 34 wherein said bit line contact plug is formed of tungsten or doped polysilicon.

39. The processor-based system of claim 34 wherein said second electrode is formed of doped polysilicon.

40. The processor-based system of claim 34 wherein said cell plug and said bit line plug are formed of doped polysilicon.

41. The processor-based system of claim 34 wherein said cell plug and said bit line plug are formed of doped hemispherical grain polysilicon.

42. The processor-based system of claim 34 wherein only the insulated sidewall, said dielectric layer and said second electrode separates said bit line contact plug from said first electrode.

43. An embedded-memory processor-based system, comprising:
   a processor;
   a memory circuit formed over a same integrated circuit as said processor, said memory circuit including a semiconductor device comprising:
      a conductor with an insulated sidewall formed on a semiconductor structure; and
      a capacitor having a dielectric layer between a first and a second electrode, said capacitor being formed adjacent said insulated sidewall such that only said insulated sidewall and said dielectric layer separates said conductor from said second electrode.

44. The embedded-memory processor-based system of claim 43 wherein said capacitor is a double-sided capacitor.

45. The embedded-memory processor-based system of claim 43 wherein only the insulated sidewall, said dielectric layer and said second electrode separates said conductor from said first electrode.

46. An embedded-memory processor-based system, comprising:
   a processor;
   a memory circuit formed over a same integrated circuit as said processor, said memory circuit including a semiconductor device comprising:
      a first insulating layer overlying at least a portion of a semiconductor structure;
      a capacitor having a dielectric layer between a first and a second conductive electrode said capacitor being formed over at least said first insulating layer, said first electrode being in electrical contact with a conductive cell plug in said semiconductor structure; and a bit line contact plug having an insulated sidewall formed adjacent to said capacitor, wherein said bit line contact plug is separated from said second electrode only by said insulated sidewall and said dielectric layer, said bit line contact plug being in electrical contact with a conductive bit line plug in said semiconductor structure.

47. The embedded-memory processor-based system of claim 46 wherein said capacitor is a double-sided capacitor.

48. The embedded-memory processor-based system of claim 46 wherein said first insulating layer and said insulated sidewall are formed of an insulating material which selectively stops a wet etch, said bit line contact plug is formed of a conductive material which stops said wet etch, and said second electrode is formed of a conductive material which stops said wet etch.

49. The embedded-memory processor-based system of claim 46 wherein said first insulating layer and said insulated sidewall are formed of $Si_3N_4$.

50. The embedded-memory processor-based system of claim 46 wherein said bit line contact plug is formed of tungsten or doped polysilicon.

51. The embedded-memory processor-based system of claim 46 wherein said second electrode is formed of doped polysilicon.

52. The embedded-memory processor-based system of claim 46 wherein said cell plug and said bit line plug are formed of doped polysilicon.

53. The embedded-memory processor-based system of claim 46 wherein said cell plug and said bit line plug are formed of doped hemispherical grain polysilicon.

54. The embedded-memory processor-based system of claim 46 wherein only the insulated sidewall, said dielectric layer and said second electrode separates said bit line contact plug from said first electrode.

55. A semiconductor device provided with a capacitor, comprising:
a conductor having an insulated sidewall formed over a substrate;
a capacitor formed adjacent said conductor, said capacitor having a dielectric layer formed between a first electrode and a second electrode, and said dielectric layer being further formed between said second electrode and said insulated sidewall whereby said insulated sidewall is separated from said second electrode only by said dielectric layer.

56. The semiconductor device of claim 55 wherein said capacitor is a double-sided capacitor.

57. A dynamic random access memory (DRAM) cell array comprising:
at least one conductor having an insulated sidewall formed thereon, said at least one conductor being formed over a substrate;
at least one DRAM cell capacitor formed adjacent said at least one conductor, said capacitor having a dielectric layer formed between a first electrode and said conductor and said dielectric layer being formed on an outer surface of a second electrode whereby said insulated sidewall is separated from said second electrode only by said dielectric layer.

58. The device of claim 57 wherein said capacitor is double-sided.

59. The device of claim 57, wherein said outer surface extends lengthwise.

60. A semiconductor device provided with a capacitor, comprising:
a first insulating layer overlying at least a portion of a semiconductor structure;
a capacitor having a dielectric layer between a first conductive electrode and a second conductive electrode, said dielectric layer being formed on an outer surface of said second electrode, said capacitor being formed over at least said first insulating layer, and said first electrode being in electrical contact with a conductive cell plug in said semiconductor structure; and
a bit line contact plug having an insulated sidewall formed adjacent to said capacitor, wherein said insulated sidewall is separated from said second electrode only by said dielectric layer, said bit line contact plug being in electrical contact with a conductive bit line plug in said semiconductor structure.

61. The semiconductor device of claim 60 wherein said cell plug and said bit line plug are formed of doped hemispherical grain polysilicon.

62. A dynamic random access memory (DRAM) cell array, comprising:
a first insulating layer overlying at least a portion of a semiconductor structure;
at least one DRAM cell capacitor having a dielectric layer formed between a first and a second electrode and formed over an outer surface of said second electrode, said capacitor being formed over at least said first insulating layer, and said first electrode being in electrical contact with a conductive cell plug in said semiconductor structure; and
at least one bit line contact plug having an insulated sidewall formed adjacent to said at least one DRAM cell capacitor, wherein said insulated sidewall is separated from said second electrode only by said dielectric layer, said bit line contact plug being in electrical contact with a conductive bit line plug in said semiconductor structure.

63. The DRAM cell array of claim 62 wherein said cell plug and said bit line plug are formed of doped hemispherical grain polysilicon.

64. A processor-based system, comprising:
a processor;
a memory circuit connected to said processor, said memory circuit including a semiconductor device comprising:
a conductor with an insulated sidewall formed over a semiconductor structure; and
a capacitor formed adjacent said conductor, said capacitor having a dielectric layer formed between a first electrode and a second electrode, and said dielectric layer being further formed between said second electrode and said insulated sidewall whereby said insulated sidewall is separated from said second electrode only by said dielectric layer.

* * * * *